(12) United States Patent
Unnikrishnan

(10) Patent No.: US 6,353,245 B1
(45) Date of Patent: Mar. 5, 2002

(54) BODY-TIED-TO-SOURCE PARTIALLY DEPLETED SOI MOSFET

(75) Inventor: Sreenath Unnikrishnan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/389,140

(22) Filed: Sep. 2, 1999

(51) Int. Cl.[7] .............................. H01L 27/01
(52) U.S. Cl. ................. 257/347; 257/348; 257/336; 257/344; 257/408
(58) Field of Search .............. 257/57, 61, 66, 257/69, 347, 348, 349, 350, 351, 352, 36, 344, 408

(56) References Cited

U.S. PATENT DOCUMENTS

| 4,965,213 A | 10/1990 | Blake | 438/154 |
| 5,001,528 A | 3/1991 | Bahraman | 257/351 |
| 5,683,918 A | 11/1997 | Smith et al. | 257/347 |

OTHER PUBLICATIONS

Prediction of ESD Protection Levels and Novel Protection Devices in Thin Film SOI Technology; Raha et al.; EOS/ESD Symposium 97; pp. 356–365, 1997.

An Approach to Analytical Modeling of Snapback in SOI Devices; Huang et al.; 1990 IEEE; pp. 15–16.

The Effect of Intrinsic Body Resistance on the Breakdown Characteristics of DBTS NFD SOI MOSFETs; Suh et al.; 1993 IEEE; pp. 68–69.

Premature Breakdown in Non–Fully Depleted SOI/MOSFETs with Body–Tied–To–Source Structure; Hwang et al.; 1991 IEEE; pp. 34–35.

Dynamic Effects in BTG/SOI MOSFETs and Circuits Due to Distributed Body Resistance; Workman et al.; Proceedings 1997 IEEE International SOI Conf., Oct. 97; pp. 28–29.

Single–Event Charge Enhancement in SOI Devices; 1990 IEEE; Massengill et al.; pp. 98–99.

Primary Examiner—Minh Loan Tran
(74) Attorney, Agent, or Firm—Carlton H. Hoel; W. James Brady; Frederik J. Telecky, Jr.

(57) ABSTRACT

A silicon-on-oxide MOS transistor is disclosed which has an implanted region on the source side of the gate electrode for making contact with the body node. A contact region of the same conductivity type as the body is formed in the source region with a minimum spacing from the patterned gate corner such that the dopant of the implant region does not diffuse into the gate and thereby destroy the transistor

8 Claims, 3 Drawing Sheets

BODY-TIED-TO-SOURCE PARTIALLY DEPLETED SOI MOSFET

BACKGROUND AND SUMMARY OF THE INVENTION

The present invention relates to body-tied-to-source transistors and to methods for fabricating such devices.

BACKGROUND: SILICON-ON-INSULATOR

Because of fundamental limitations on bulk insulated gate field effect transistors (MOSFET), it is difficult to achieve significant further improvement by changing the dimensions. Therefore, MOSFETs can only be improved significantly by changing the basic operation of the transistor. One important area of development over the last several years has been the use of silicon-on-insulator (SOI) devices to improve performance of MOSFETs. In SOI structures, the active semiconductor regions lie on top of an insulator layer. Thus each device on the integrated chip is formed from a separate mass of silicon (or other semiconductor), and the separate masses of silicon are electrically isolated from each other. One advantage of using SOI structures is that the parasitic capacitances that exist in bulk devices can be significantly reduced. Other advantages of SOI include some unique properties that allow low-power and low-voltage operations to be improved, and also (in some applications) enhance resistance to radiation damage.

BACKGROUND: PARTIALLY DEPLETED SOI MOSFETS

The most common device to be developed using SOI materials is a "partially depleted" SOI device. This name comes from the fact that the devices are constructed in a semiconductor layer which is thick enough that the channel region will not be fully depleted through its full thickness when the device is off. The advantage of this kind of structure is that the device operation and the device design are very close to the operation and design of a bulk complementary MOS (CMOS) device. However, there are several significant differences.

One difference is the floating-substrate effect. In bulk transistors, electrical connection is easily made through the substrate to the body node of a MOS transistor. The relatively fixed bias of the body node provides for a stable threshold voltage relative to the drain-to-source voltage. Conventional SOI transistors have the body node, the undepleted volume within the body region underlying the gate electrode, electrically floating, as the body node is isolated from the substrate by the underlying insulator film. When sufficient drain-to-body bias is applied, impact ionization can generate electron-hole pairs near the drain. Because majority carriers travel to the body node while the minority carriers travel to the drain, the electron-hole pairs near the drain cause a voltage differential to build up between the body node and the source of the transistor. This voltage differential lowers the effective threshold voltage and increases the drain current.

Another problem the floating body node of the SOI transistor presents is a parasitic "back channel" transistor. The substrate acts as the gate and the insulator film underlying the transistor acts as the gate dielectric. This back channel provides for a drain-source leakage path along the body node near the interface with the insulator film. Additionally, the dielectrically isolated body node allows capacitive coupling between the body node and the gate, and diode coupling between the body node and the source and drain. These two phenomena act to bias the body node and thus affect the threshold voltage. Each of these factors can contribute to undesirable performance shifts in the transistor relative to design, as well as to increased instability of the transistor operating characteristics.

BACKGROUND: BODY TIED-TO-SOURCE SOI

One approach, and the most direct approach, to resolving the floating-substrate problem is to prevent the charge from forming by creating a direct contact on the substrate to the source contact of the transistor. This eliminates the floating-substrate charging, but it complicates the layout of the device.

Prior to 1993, SOI devices used only lightly doped shallow source drain implants to improve resistance to punchthrough as well as improve hot carrier liability. The body-tied-to-source method of Blake (U.S. Pat. No. 4,965, 213) was perfectly suited to devices of this type. (See FIG. 6 for a diagram of Blake's method applied to a transistor with lightly doped shallow source drain implants, but without halo implants.) However, after 1993, halo ion implants were added to SOI devices to further improve resistance to punchthrough. The prior art is not compatible with such devices. The method of Blake, if applied to these new structures, would result in a device (see FIG. 5) that would not tie the body to the source. This is because the halo implant 560 on the source side of the transistor that would result using Blake's method is n-type semiconductor material while the body node 570 of the transistor is p-type semiconductor material. The body-tie implant 520 is also p-type semiconductor material. Therefore, since the halo implant 560 between the body-tie 520 and the body-node 570 is a different conductivity type, no electrical connection is made between the body 570 and the source 516 of the transistor.

Therefore a new body-tied-to-source method is needed to alleviate breakdown problems in partially depleted silicon-on-oxide insulated-gate field effect transistors (PD-SOI MOSFETs).

Innovative Structures and Methods

The present application discloses a body-tied-to-source semiconductor-on-insulator insulated-gate field effect transistor where the body-tie diffusion, which is used for tying the body to the source, is located within a "cut-out" of the source diffusion, where the source diffusion is not symmetric with the drain diffusion. (In one sample embodiment, the body-tie diffusion is ohmically connected to the source diffusion by a surface silicide layer.) Preferably the body-tie diffusion is laterally separated from the gate corner by a gap which is wide enough to avoid any diffusion of dopants from the body-tie diffusion into the channel region. This gap receives the shallow (MDD) drain extension implant, but not the main (n+ or p+) source/drain implant. Conduction from the well-tie implant to the channel region can occur using the portion of the body which lies beneath the MDD diffusion; this portion of the body would be wholly or partially blocked if it were exposed to the main source/drain implant.

Advantages of the disclosed methods and structures, in various embodiments, include some or all of the following: reduced process complexity and cost; minimal parasitic capacitance with maximal drive current, without the need for developing new processes; and/or easy alignment of the deep source/ drain (S/D) mask; compatibility with SOI or TFT processes using halo implants.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIRST DEVICE EMBODIMENT

Figure 1:
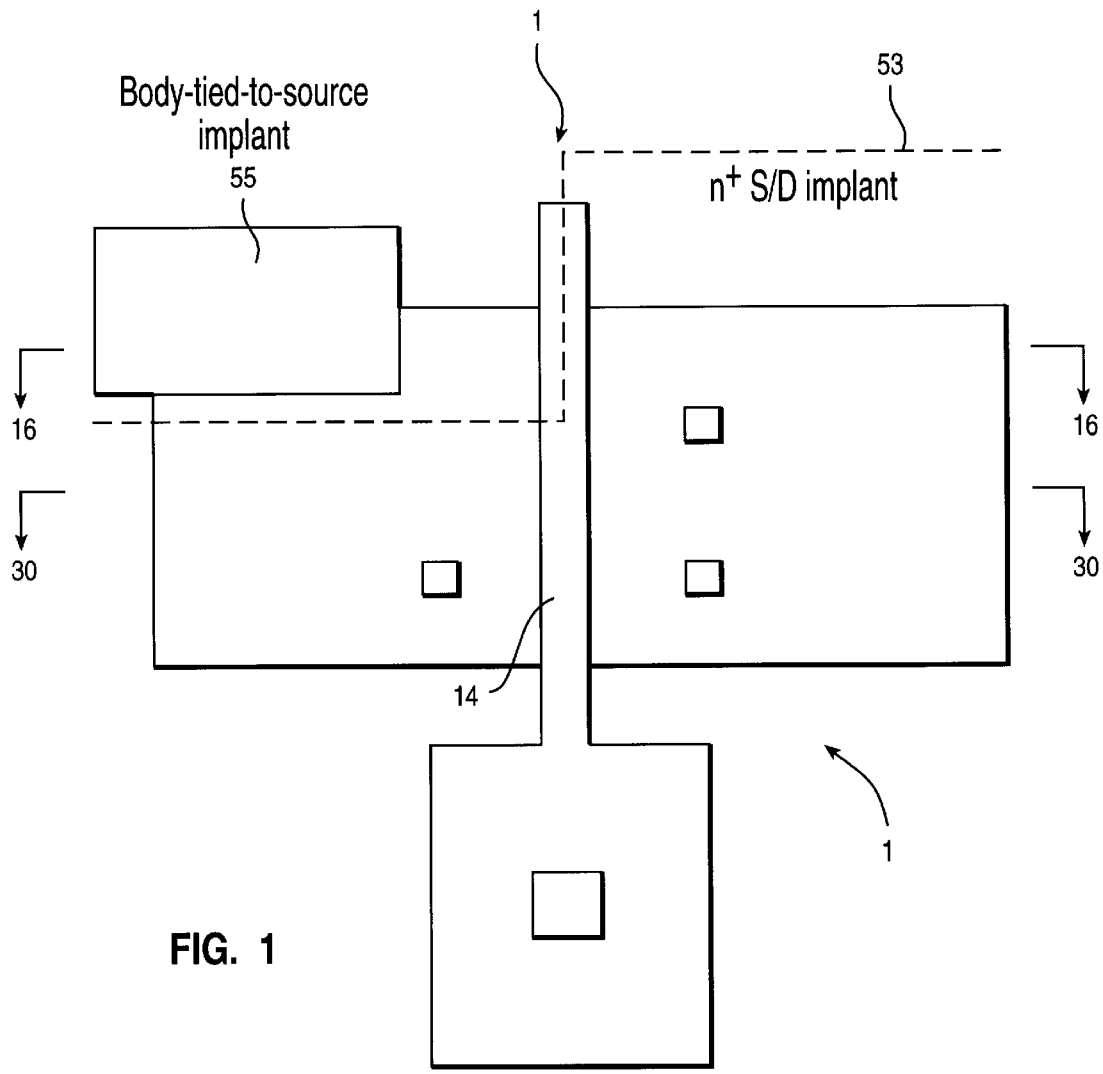
FIG. 1 shows the body-tie mask and drain diffusion mask regions of a body-tied-to-source partially depleted silicon-on-insulator insulated gate field effect transistor (BTS PD SOI MOSFET).

Transistor 1 is an n-channel body-tied-to-source partially depleted silicon-on-insulator insulated-gate field effect transistor (BTS PD SOI MOSFET) and is shown in plan view in FIG. 1. Transistor 1 includes a contact between the source cladding 13 (a silicide in this example) and the body nodes 9. FIG. 1 shows the mask layout for the BTS PD SOI MOSFET where the p+ contact region lies under the body-tie mask 55. The heavily doped drain diffusion region 53 and the gate 14 are also shown. The plan view of FIG. 1 shows that the p+ contact region 5 which lies under the body-tie mask 55 to be at the edge of the mesa and spaced away from the gate electrode 14 and sidewall filaments 7.

Figure 3:
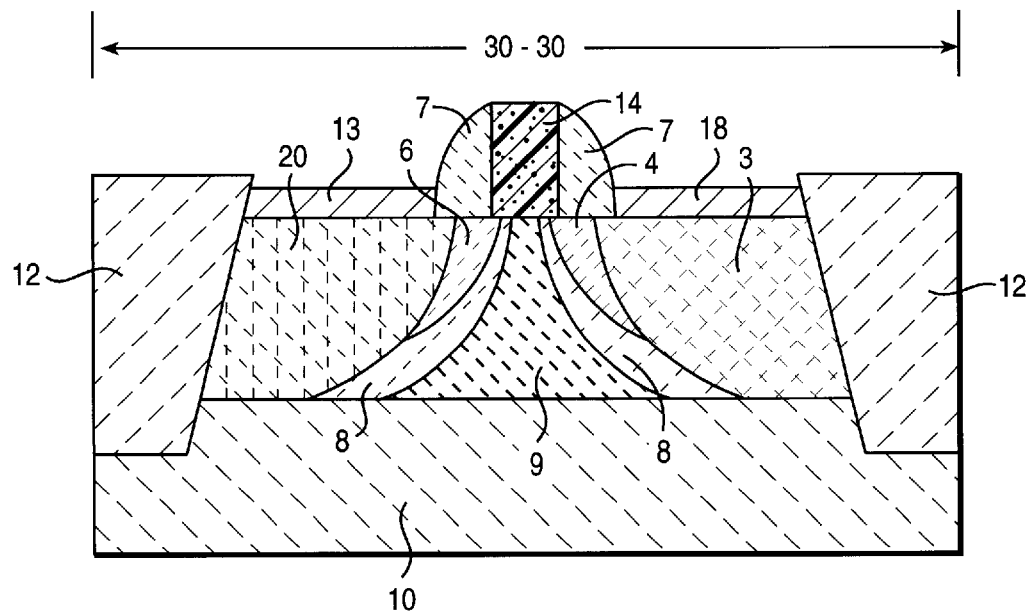
FIG. 3 shows a cross section of the transistor of FIG. 1 in an area away from the body-tie implant.

FIG. 3 shows a cross section 30 of the n-channel BTS PD SOI MOSFET 1. The body node 9 is a lightly doped n-channel region. The heavily doped source diffusion region 20 and heavily doped drain diffusion region 3 are n+ type semiconductors. The shallow lightly doped drain 4 and the lightly doped shallow source 6 implants are n-type semiconductor and do not extend to the bottom of the silicon layer, therefore allowing for contact between the source cladding 13 and the body node 9. (The lightly doped shallow source drain implants 4 and 6 help reduce hot-carrier effects.)

Figure 2:
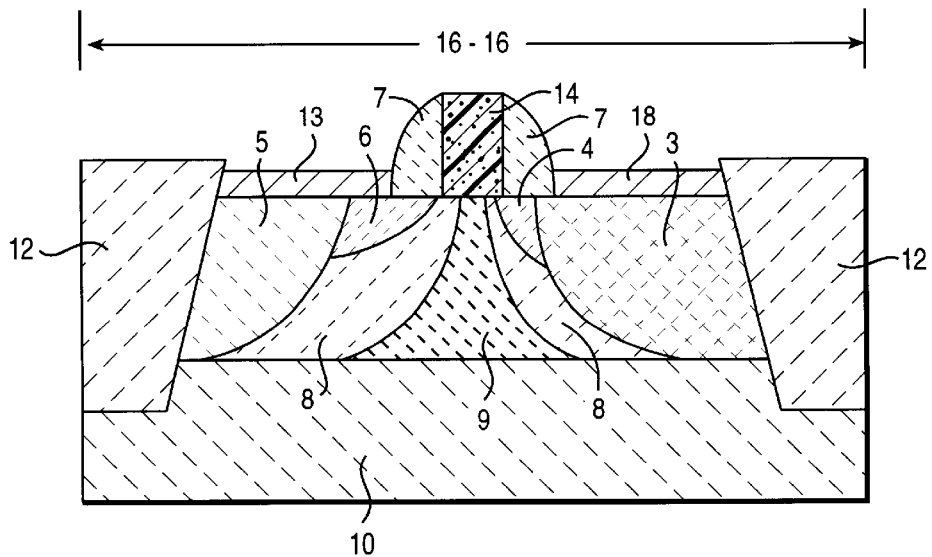
FIG. 2 shows a cross section of the transistor of FIG. 1 in the area of the body-tie implant.

FIG. 2 shows a cross section 16 of the n-channel BTS PD SOI MOSFET 1. The body node 9 is connected to the source cladding 13 via the body-tie implant region 5. The connection is possible because the body-tie implant region 5 is of the same conductivity type, p+ type semiconductor, as the body node 9. The body-tie implant region 5 alleviates the problems of the floating body node 9. The body-tie implant region 5 is spaced 120 nm from the patterned gate corner, that is further from the gate 14 edge than the drain cladding region 18 is from the edge of gate 14. By spacing the body-tie implant region 5 away from the gate 14, the chance of p-type material diffusing into the channel below the gate region 14, and thereby destroying the transistor 1, is significantly reduced. It also allows for more tolerance in placement of the body-tie implant region 5, since even under the most extreme case of misalignment, the p-type material will not diffuse into the channel under the gate region 14. Further tolerance in the placement of the body-tie implant region 5 is provided by the presence of the sidewall spacers 7.

The p-type halo implants 8 help to further reduce hot-carrier effects by increasing the area over which the field acts on the electrons. Because the halo implants 8 are of the same conductivity type as the body node 9 and the body-tie implant region 5, they do not hinder the connection between the body 9 and the source cladding 13 of the transistor 1.

The transistor 1 sits on top of an insulating dielectric 10 (e.g. $SiO_2$), and the transistor 1 is electrically isolated from other transistors on the chip using shallow trench isolation (STI) 12.

Alternate Embodiment: P-Channel

In an alternative embodiment, the body node is a lightly doped n-type region. The medium doped drain and source regions are p-type semiconductor and the halo implants are n-type semiconductor. The heavily doped drain diffusion and source diffusion are n+ type. In this embodiment an n+ type body-tie diffusion is used to connect the source cladding to the body node.

Alternate Embodiment: Silicon-on-Sapphire

In an alternative embodiment, a sapphire layer is used to provide the insulating layer 10.

Alternate Embodiment: Thin Film Transistor

In an alternative embodiment, the transistor is a thin film transistor ("TFT") rather than a semiconductor-on-insulator transistor. In such embodiments the transistor channel may be polycrystalline rather than monocrystalline. It should also be noted that the transistor channel need not directly overlie a semiconductor substrate. For example, the channel may be formed in an upper level of an integrated circuit structure, or may be part of an electronic structure which is not an integrated circuit. However, this embodiment is less preferred with typical present TFT processes, in which halo implants are usually not used.

Alternate Embodiment: Transistor Without Halo Implant

Figure 4:
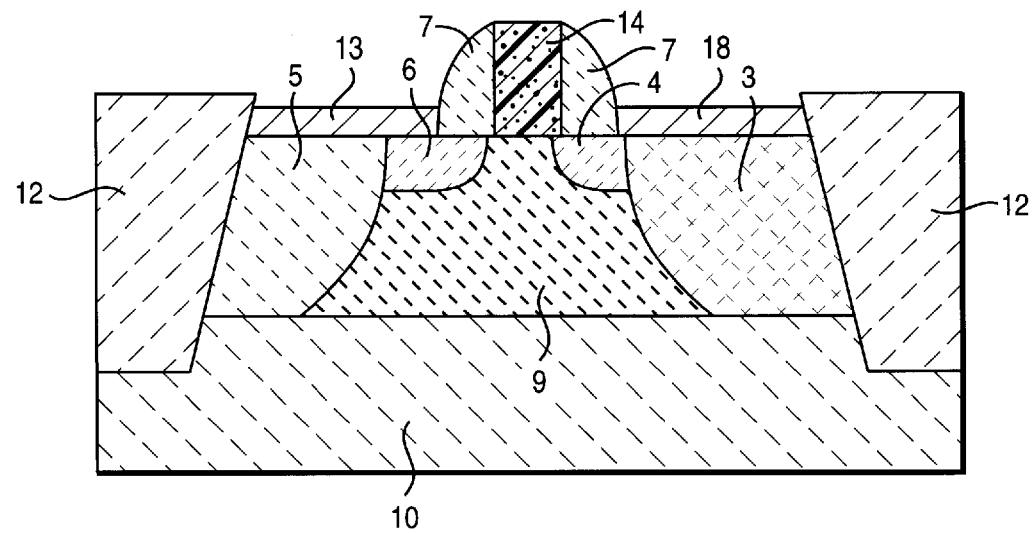
FIG. 4 shows a cross section of a body-tied-to-source partially depleted silicon-on-insulator insulated gate field effect transistor without halo implants.
Figure 5:
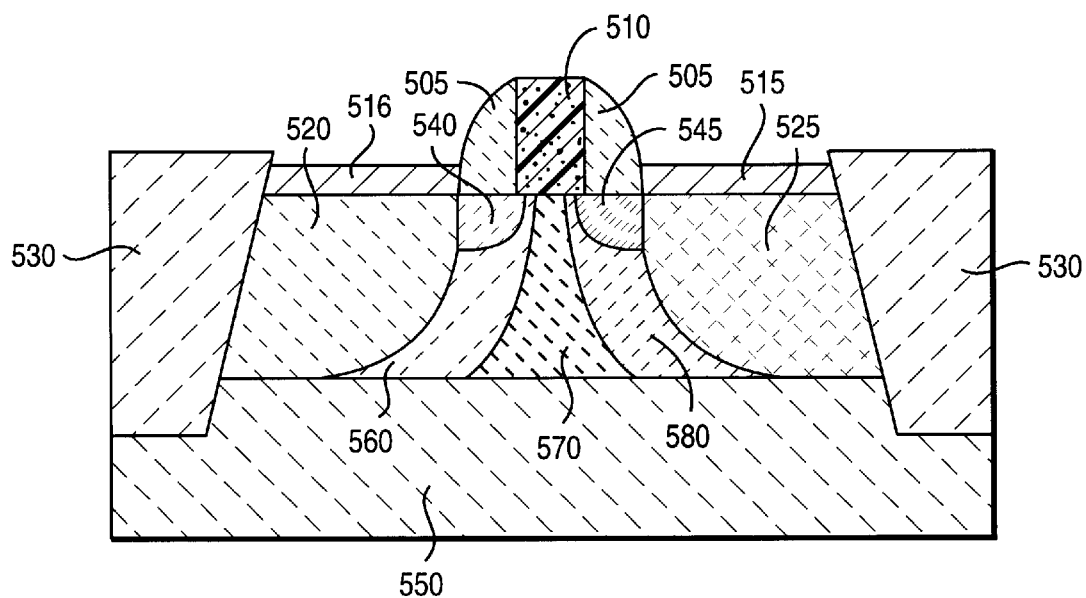
FIG. 5 shows a cross section of a (hypothetical) body-tied-to-source partially depleted silicon-on-insulator insulated gate field effect transistor with halo implants using the method of Blake.
Figure 6:
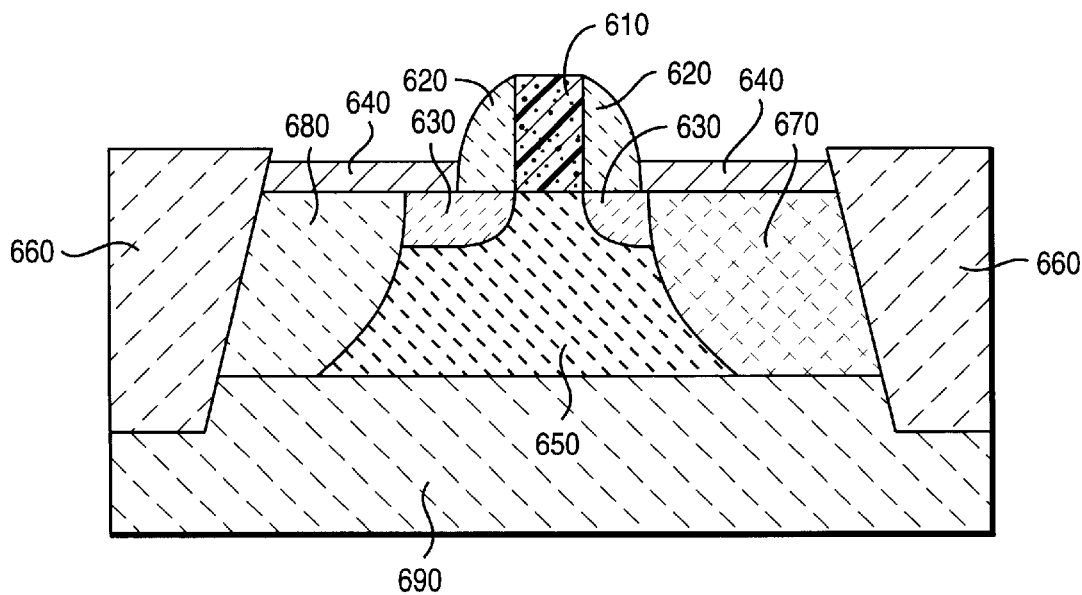
FIG. 6 shows a cross section of a body-tied-to-source partially depleted silicon-on-insulator insulated gate field effect transistor without halo implants using the method of Blake.

FIG. 4 depicts an alternative embodiment in which the transistor does not have halo implants.

Alternate Embodiment: Other Semiconductor Materials

In another class of alternative embodiments, the semiconductor material does not have to be silicon. For example, in one class of embodiments the semiconductor can be silicon-germanium (e.g. with 20% at of Ge).

FIRST PROCESS EMBODIMENT:

Transistor 1 is fabricated, in the presently preferred embodiment, using the following process. A thin layer of silicon approximately 150 nm thick is deposited over an insulating oxide 10 substrate using chemical vapor deposition (CVD). A narrow trench is etched in the silicon using a nitride mask and reactive ion etching. The sidewalls of the trench 12 are oxidized and the trench is filled with polysilicon by chemical vapor deposition (CVD) and the top surface is etched flat and oxidized to form a planar region over the trench 12.

Next, lightly dope the body region 9 (e.g. 1E17 cm$^{-3}$ boron). Follow this step by doping (e.g. 6E17 cm$^{-3}$ boron) halo implant regions 8.

The next step in the process is depositing a layer of photoresist and performing photolithography. Next etch and diffuse medium doped drain and remove photoresist. The n$^-$MDD junction depth is 60 nm and the peak dopant concentration is 5E19 cm$^{-3}$. Next, the gate dielectric is formed from (in this example) grown SiO$_2$ to a thickness of 4 nm. The gate length is 210 nm. Next, form an inverse p+ body-tie mask 55 and implant the p+ body-tie implant region 5 with a dopant concentration of (in this example) 1E20 cm$^{-3}$. The offset of the body-tie mask from the patterned gate corner is 120 nm. Next the photoresist body-tie mask is removed and the mask for the heavily doped drain diffusion 53 is formed. The n+ dopant is implanted and diffused to achieve an n+ concentration of 2E20 cm$^{-3}$. The average V$_t$ implant concentration is 2E17 cm$^{-3}$. Silicide cladding layers 13 and 18 are then formed by conventional methods.

According to certain disclosed embodiments of the present invention, there is provided: A transistor, comprising: a gate capacitively coupled to a fully-insulated semiconductor body region which includes a first-conductivity-type channel region interposed between source and drain diffusions which are both of a second conductivity type; a first-conductivity-type body-tie diffusion which ohmically connects said body region to said source, and which is set back from said gate farther than said drain diffusion.

According to certain disclosed embodiments of the present invention, there is provided: A semiconductor-on-insulator transistor, comprising: a gate capacitively coupled to a semiconductor body region which overlies and is laterally surrounded by insulating regions, and which includes a first-conductivity-type channel region interposed between source and drain diffusions which are both of a second conductivity type; and a first-conductivity-type body-tie diffusion which ohmically connects said body region to a metallic structure which contacts said source; wherein one part of the width of said gate borders both said source and drain diffusions, and another part of the width of said gate borders only said drain diffusion; and wherein said body-tie diffusion is closest to said another part of said gate.

According to certain disclosed embodiments of the present invention, there is provided: A transistor, comprising: a body region, and a body-tie diffusion therein which is of the same conductivity type as said body region and which ohmically connects said body region to a source diffusion; wherein said body-tie diffusion displaces only part of the width of said source diffusion.

According to certain disclosed embodiments of the present invention, there is provided: A method of fabricating a body tied to source transistor, comprising the steps of: forming a semiconductor body region; forming a gate and sidewall spacers; forming at least one halo diffusion which is aligned to said gate and has the same conductivity type as said body region; forming LDD/MDD regions with conductivity type opposite to said body region; doping a body-tie diffusion with the same conductivity type as the body; forming source and drain diffusions with a conductivity type opposite to that of said body; and cladding said source, drain, and body-tie diffusions with a material of metallic conductivity, to thereby form an ohmic connection between said source diffusion and said body-tie diffusion.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, a variety of techniques can be used to form the basic semiconductor-on-insulator structure, including SIMOX, wafer bonding, etc.

In other classes of alternative embodiments Si-Ge-C or InP or other semiconductor materials can be used.

What is claimed is:

1. A transistor, comprising:
  a gate capacitively coupled to a fully-insulated semiconductor body region which includes a first-conductivity-type channel region interposed between source and drain diffusions which are both of a second conductivity type;
  a first-conductivity-type body-tie diffusion which ohmically connects said body region to said source, and which is set back from said gate farther than said drain diffusion.

2. The integrated circuit of claim 1, wherein said source and drain diffusions are cladded with a conductive material, and wherein said body-tie diffusion and said source are both cladded by a common portion of said conductive material but are not otherwise ohmically connected.

3. The integrated circuit of claim 1, wherein said body-tie diffusion is P-type and said source and drain diffusions are N-type.

4. The integrated circuit of claim 1, wherein said body-tie diffusion is N-type and said source and drain diffusions are P-type.

5. The integrated circuit of claim 1, wherein said transistor further comprises a halo implant adjacent to said source and drain diffusion regions.

6. The integrated circuit of claim 1, wherein said body region is formed in a semiconductor-on-insulator structure.

7. A semiconductor-on-insulator transistor, comprising:
  a gate capacitively coupled to a semiconductor body region which overlies and is laterally surrounded by insulating regions, and which includes a first-conductivity-type channel region interposed between source and drain diffusions which are both of a second conductivity type; and
  a first-conductivity-type body-tie diffusion which ohmically connects said body region to a metallic structure which contacts said source;
  wherein one part of the width of said gate borders both said source and drain diffusions, and another part of the width of said gate borders only said drain diffusion;
  and wherein said body-tie diffusion is closest to said another part of said gate.

8. A transistor, comprising:
  a body region, and a body-tie diffusion therein which is of the same conductivity type as said body region and which ohmically connects said body region to a source diffusion;
  wherein said body-tie diffusion displaces only part of the width of said source diffusion and said body-tie diffusion is spaced from a gate of said transistor.

* * * * *

UNITED STATES PATENT AND TRADEMARK OFFICE
CERTIFICATE OF CORRECTION

PATENT NO. : 6,353,245 B1 Page 1 of 1
APPLICATION NO. : 09/389140
DATED : March 5, 2002
INVENTOR(S) : Sreenath Unnikrishnan It is certified that error appears in the above-identified patent and that said Letters Patent is hereby corrected as shown below:

Cover Page, insert Item [60] under Related U.S. Application Data

--Provisional Application No. 60/099, 141 filed 09/04/1998.--

Signed and Sealed this

Twenty-eighth Day of November, 2006

JON W. DUDAS
*Director of the United States Patent and Trademark Office*